(12) United States Patent  
Yang et al.

(10) Patent No.: US 12,114,436 B2
(45) Date of Patent: Oct. 8, 2024

(54) COMPOSITE CIRCUIT BOARD AND METHOD OF MANUFACTURING THE SAME

(71) Applicant: SHENNAN CIRCUITS CO., LTD., Shenzhen (CN)

(72) Inventors: Zhicheng Yang, Shenzhen (CN); Xianyou Deng, Shenzhen (CN); Jinfeng Liu, Shenzhen (CN); Hegen Zhang, Shenzhen (CN); Tao Luo, Shenzhen (CN); Zhishen Wang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 177 days.

(21) Appl. No.: 18/054,157

(22) Filed: Nov. 10, 2022

(65) Prior Publication Data

US 2023/0072239 A1 Mar. 9, 2023

Related U.S. Application Data

(63) Continuation of application No. PCT/CN2020/136220, filed on Dec. 14, 2020.

(30) Foreign Application Priority Data

Sep. 9, 2020 (CN) .......................... 202010942728.1

(51) Int. Cl.
*H05K 3/36* (2006.01)
*H05K 1/14* (2006.01)
*H05K 3/46* (2006.01)

(52) U.S. Cl.
CPC ............. *H05K 3/361* (2013.01); *H05K 1/142* (2013.01); *H05K 3/4611* (2013.01); *H05K 2201/09163* (2013.01); *H05K 2203/061* (2013.01)

(58) Field of Classification Search
CPC ................. H05K 3/361; H05K 3/4611; H05K 2201/09163; H05K 2201/09845; H05K 3/4691

See application file for complete search history.

(56) References Cited

U.S. PATENT DOCUMENTS 5,206,463 A * 4/1993 DeMaso ............... H05K 3/4691
174/262
7,378,596 B2 * 5/2008 Kawaguchi .......... H05K 3/4691
174/262

(Continued)

FOREIGN PATENT DOCUMENTS

CN 102036466 A 4/2011
CN 102740612 A 10/2012

(Continued)

OTHER PUBLICATIONS

European Search Report, European Application No. 20953137.5, mailed Nov. 27, 2023 (43 pages).

(Continued)

*Primary Examiner* — Sherman Ng (57) ABSTRACT

A composite circuit board includes a flexible board, rigid boards, adhesive layers, and protection glue; the adhesive layers are sandwiched between the rigid boards and the flexible board and used for bonding the rigid boards and the flexible board; the rigid boards are provided with step slots passing through the rigid boards; the adhesive layers are provided with through slots passing through the adhesive layers; the step slots and the through slots are communicated with each other to form a thinning recess; the thinning recess exposes the flexible board; and the protection glue covers steps of the thinning recess and at least a portion of the exposed area of the flexible board.

20 Claims, 4 Drawing Sheets

(56) References Cited

U.S. PATENT DOCUMENTS

| | | | |
|---|---|---|---|
| 2008/0047135 A1 | 2/2008 | Arnold | |
| 2016/0066429 A1* | 3/2016 | Taniguchi | H05K 1/0281 |
| | | | 361/749 |
| 2017/0374732 A1* | 12/2017 | Denda | H05K 3/361 |
| 2020/0053887 A1* | 2/2020 | Bund | H05K 1/0271 |

FOREIGN PATENT DOCUMENTS

| | | |
|---|---|---|
| CN | 109429443 A | 3/2019 |
| CN | 210629974 U | 5/2020 |
| CN | 213638364 U | 7/2021 |
| JP | H06268339 A | 9/1994 |
| JP | H06302962 A | 10/1994 |
| JP | 2007049076 A | 2/2007 |

OTHER PUBLICATIONS

International search report and Written Opinion of the International Search Authority, International Application No. PCT/CN2020/136220, mailed Jun. 16, 2021 (4 pages).

Chinese Notification to Grant Patent Right for Invention, Chinese Application No. 202010942728.1, mailed May 30, 2024 (5 pages).

* cited by examiner

COMPOSITE CIRCUIT BOARD AND METHOD OF MANUFACTURING THE SAME

CROSS REFERENCE TO RELATED APPLICATIONS

The present application is a continuation-application of International (PCT) Patent Application No. PCT/CN2020/136220, filed on Dec. 14, 2020, which claims the priority of the Chinese patent application No. 202010942728.1, filed on Sep. 9, 2020, and the entire contents of which are hereby incorporated by reference in their entireties.

TECHNICAL FIELD

The present disclosure relates to the field of circuit board manufacturing, and in particular to a composite circuit board and a method of manufacturing a composite circuit board.

BACKGROUND

A rigid-flex board has advantages of a rigid board and a flexible board and may be rigid and bendable.

The rigid-flex board in the art usually includes a rigid board and a flexible board. In order to enhance bending performance at a connection between the rigid board and the flexible board, adhesive may be dispensed at the connection between the rigid board and the flexible board to protect the soft board. In this way, the bending performance at the connection between the rigid board and the flexible board may be superior. However, for the rigid-flex board in the art, an overflow of the adhesive may be present at the connection between the rigid board and the flexible board, such that surface flatness of the rigid-flex board may be reduced, a strength that the adhesive bonds to the rigid-flex board may be low.

SUMMARY OF THE DISCLOSURE

The present disclosure provides a composite circuit board and a method of manufacturing a composite circuit board to solve a technical problem that the dispensed adhesive of the composite circuit board may be easily fallen off.

According to an aspect of the present disclosure, a composite circuit board is provided and includes: a flexible board, a rigid board, an adhesive layer and a protective adhesive. The adhesive layer is disposed between the rigid board and the flexible board and configured to bond the rigid board with the flexible board. The rigid board defines a stepped groove that extends through the rigid board, the adhesive layer defines a through slot that extends through the adhesive layer, the stepped groove and the through slot are communicated with each other to form a thinning groove. The flexible board is exposed from the thinning groove. The protective adhesive covers at least one stepped wall of the thinning groove and at least a part of an exposed region of the flexible board. A height of one of the at least one stepped wall adjacent to the flexible board is in a range of 0.05 mm to 0.5 mm in a lamination direction of the composite circuit board; and a width of an orthographic projection of each of the at least one stepped wall onto the flexible board in a direction perpendicular to the lamination direction is in a range of 0.5 mm to 2.5 mm.

According to an aspect of the present disclosure, a composite circuit board is provided and includes: a flexible board, a rigid board, an adhesive layer and a protective adhesive. The adhesive layer is disposed between the rigid board and the flexible board and configured to bond the rigid board with the flexible board. The rigid board defines a stepped groove that extends through the rigid board, the adhesive layer defines a through slot that extends through the adhesive layer, the stepped groove and the through slot are communicated with each other to form a thinning groove. The flexible board is exposed from the thinning groove. The protective adhesive covers at least one stepped wall of the thinning groove and at least a part of an exposed region of the flexible board.

According to another aspect of the present disclosure, a method of manufacturing a composite circuit board is provided and includes: providing a core plate assembly, wherein the core plate assembly comprises a flexible board, a rigid board and an adhesive layer, the adhesive layer is disposed between the rigid board and the flexible board and is configured to bond the rigid board and the flexible board; defining a groove in the core plate assembly to define a thinning groove, which extends through the rigid board and the adhesive layer and exposes the flexible board, wherein the thinning groove has at least one stepped wall; applying a protective adhesive on the at least one stepped wall, and enabling the protective adhesive to flow to reach the flexible board; and curing the protection adhesive.

BRIEF DESCRIPTION OF THE DRAWINGS

In order to illustrate more clearly technical solutions in the embodiments of the present disclosure, the accompanying drawings for the description of the embodiments will be briefly described in the following. Apparently, the following drawings show only some of the embodiments of the present disclosure, any ordinary skilled person in the art shall obtain other drawings based on these drawings without any creative work.

DETAILED DESCRIPTION

The present disclosure will be described in further detail below by referring to the accompanying drawings and embodiments. In particular, the following embodiments are intended to illustrate the present disclosure only, but do not limit the scope of the present disclosure. Similarly, the following embodiments show only some but not all embodiments of the present disclosure. All other embodiments obtained by any ordinary skilled person in the art without creative work shall fall within the scope of the present disclosure.

The terms "first" and "second" are used for descriptive purposes only and shall not be interpreted as indicating or implying relative importance or implicitly specifying the number of technical features. Therefore, a feature defined by "first" and "second" may explicitly or implicitly include at least one such feature. In the description of the present disclosure, "a plurality of" means at least two, such as two, three, and so on, unless otherwise expressly and specifically limited. Furthermore, the terms "including", "having", and any variation thereof, are intended to cover non-exclusive inclusion. For example, a process, a method, a system, a product or a device including a series of operations or units is not limited to the listed operations or units, but may further include operations or units that are not listed, or include other operations or units that are inherently included in the process, the method, the system, the product or the device.

The term "embodiments" means that particular features, structures or properties described by referring to an embodiment may be included in at least one embodiment of the present disclosure. The term in various sections in the specification does not necessarily mean a same embodiment, nor is it a separate or alternative embodiment that is mutually exclusive with other embodiments. Any ordinary skilled person in the art shall explicitly and implicitly understand that the embodiments described herein may be combined with other embodiments.

Figure 1:
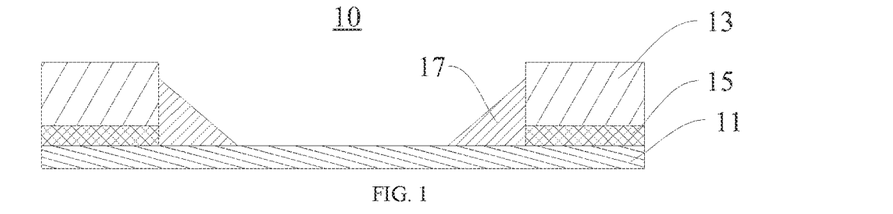
FIG. 1 is a cross-sectional view of a composite circuit board in the art.

As shown in FIG. 1, FIG. 1 is a cross-sectional view of a composite circuit board in the art. The composite circuit board 10 includes a flexible board 11, a rigid board 13, an adhesive layer 15 and a protective adhesive 17. The adhesive layer 15 is disposed between the rigid board 13 and the flexible board 11 and is configured to bond the rigid board 13 and the flexible board 11. The protective adhesive 17 is disposed at a connection between the rigid board 13 and the flexible board 11 to enhance bending-resistance performance of the composite circuit board 10.

While producing the composite circuit board 10, an adhesive layer material may be arranged on the flexible board 11, and the rigid board 13 may be arranged on a side of the adhesive layer material away from the flexible board 11. Further, the flexible board 11, the adhesive layer material and the rigid board 13, which are laminated on each other, are pressed, such that the rigid board 13 may be bonded to the flexible board 11. While pressing the laminated boards, the bonding layer material, which is in a liquid phase, may flow from a gap between the rigid board 13 and the flexible board 11 due to a pressing force, and may further flow to a surface of the flexible board 11 adjacent to the rigid board 13, such that flatness of the flexible board 11 may be reduced. When the adhesive is further dispensed at the connection between the flexible board 11 and the rigid board 13, the operation of dispensing the adhesive may be performed difficultly. In addition, a bonding strength between the protective adhesive 17, which is formed by dispensing the adhesive, and the rigid board 13 and the flexible board 11 may be low. When the composite circuit board 10 is bent, the protective adhesive 17 may be easily fallen off.

Figure 2:
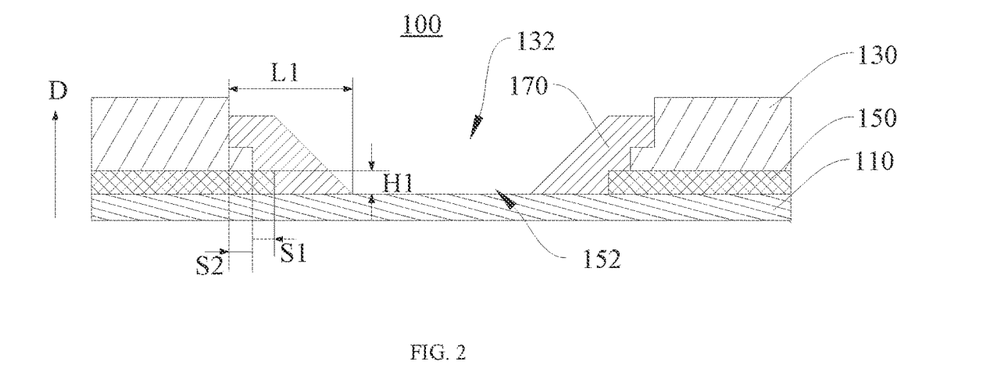
FIG. 2 is a cross-sectional view of a composite circuit board according to an embodiment of the present disclosure.

Therefore, the present disclosure provides a composite circuit board 100, as shown in FIG. 2. FIG. 2 is a cross-sectional view of a composite circuit board according to an embodiment of the present disclosure. The composite circuit board 100 includes a flexible board 110, a rigid board 130, an adhesive layer 150 and a protective adhesive 170. The adhesive layer 150 is disposed between the rigid board 130 and the flexible board 110 and is configured to bond the rigid board 130 to the flexible board 110. The rigid board 130 defines a stepped groove 132 that extends through the rigid board 130. The adhesive layer 150 defines a through slot 152 that extends through the adhesive layer 150. The stepped groove 132 and the through slot 152 are communicated with each other to form a thinning groove. The flexible board 110 is exposed from the thinning groove. The protective adhesive 170 covers a stepped wall of the thinning groove and at least a part of an exposed region of the flexible board 110.

According to the present disclosure, the stepped groove 132 is defined in the rigid board 130, and the through slot 152 is defined in the adhesive layer 150. The stepped groove 132 and the through slot 152 are communicated with each other to form the thinning groove. The surface of the flexible board 110 is exposed from the thinning groove. The protective adhesive 170 covers the stepped wall of the thinning groove and the part of the side wall of the flexible board 110 that is adjacent to and exposed from the thinning groove. In this way, the surface of the adhesive layer 150 and the surface of the flexible board 110 may be flat, the adhesive may be easily dispensed; and further, the contact area that the protective adhesive 170 and the rigid board 130 contacts the adhesive layer 150 may be increased. Therefore, the bonding strength between the protective adhesive 170 and the composite circuit board 100 may be improved, preventing the protective adhesive 170 from falling off from the composite circuit board 100, which may be caused by the composite circuit board 100 being bent at the connection between the rigid board 130 and the flexible board 110.

Materials of the rigid board 130 and the flexible board 110 and a method of manufacturing the rigid board 130 and the flexible board 110 are available to any ordinary skilled person in the art and may be referred to from the art. The present disclosure will note describe the materials and the manufacturing method in detail.

In some embodiments, the adhesive layer 150 may be made of at least one of a pure adhesive or a semi-cured sheet.

For example, in an embodiment, the adhesive layer 150 may be made of the pure adhesive. In detail, a layer of pure adhesive may be coated to a surface of the flexible board 110. The rigid board 130 may be bonded to the flexible board 110. Taking the pure adhesive to bond the flexible board 110 with the rigid board 130 may be performed at room temperature. In this way, a process of connecting the rigid board 130 with the flexible board 110 may be simplified.

The pure adhesive may be a normal pure adhesive or a high speed pure adhesive. For example, in an embodiment, the adhesive layer 150 may be made of the high speed pure adhesive, and a dielectric loss of the high speed pure adhesive may be less than or equal to 3.0. In the present embodiment, the high speed pure adhesive having a dielectric loss of less than or equal to 3.0. On one hand, the high speed pure adhesive has better bending performance, and requirements of a small bending radius and dynamic bending may be satisfied. On the other hand, the dielectric loss of the high speed pure adhesive may be less than or equal to 3.0, a signal transmission loss may be reduced, such that the composite circuit board 100 may have a low transmission loss and better performance.

In another embodiment, the adhesive layer 150 may be made of the semi-cured sheet. In detail, a solid semi-cured sheet may be arranged on the surface of the flexible board 110. The rigid board 130 may be disposed on a side of the semi-cured sheet away from the flexible board 110. A heat-pressing operation may be performed on the flexible board 110, the semi-cured sheet and the rigid board 130, which are laminated on each other, such that the flexible board 110, the semi-cured sheet and the rigid board 130 may form an integral one-piece structure. By taking the semi-cured sheet to bond the flexible board 110 and the rigid board 130, a height of the adhesive layer 150 may be easily controlled.

Properties and composition of the semi-cured sheet may be available to any ordinary skilled person in the art and will not be described herein.

In some embodiments, the protective adhesive 170 may be at least one of an epoxy adhesive or an acrylic adhesive.

For example, in an embodiment, the protective adhesive 170 may be the epoxy adhesive. In another embodiment, the protective adhesive 170 may be the acrylic adhesive. In still another embodiment, the protective adhesive 170 may be a mixture of the epoxy adhesive and the acrylic adhesive.

Further, as shown in FIG. 2, a side wall of the stepped groove 132 has a side facing towards an inside of the thinning groove, and a side wall of the through slot 152 is disposed on the side of the side wall of the stepped groove 132, such that another stepped wall is formed in the thinning groove.

In detail, in the present embodiment, the stepped groove 132 has a stepped wall. The side wall of the through slot 152 is protruding relative to the side wall of the stepped groove 132 towards the inside of the thinning groove. That is, a cross-sectional aera of the through slot 152 is less than a cross-sectional area of the side of the stepped groove 132 near the adhesive layer 150. In this way, at least a part of a circumference of the adhesive layer 150 is exposed out of the rigid board 130, such that a stepped wall (i.e., the another stepped wall) is formed. The protective adhesive 170 covers the stepped wall inside the stepped groove 132, the surface of the adhesive layer 150 exposed out of the rigid board 130, a side of the adhesive layer 150 adjacent to the flexible board 110, and a part of a surface of the flexible board 110 adjacent to the adhesive layer 150. In this way, the contact area between the protective adhesive 170 and the rigid board 130 and between the protective adhesive 170 and the adhesive layer 150 may be increased, and the connection between the protective adhesive 170 and the composite circuit board 100 may be stronger.

In some embodiments, the number of stepped walls inside the stepped groove 132 may also be two, three, four, and so on. The number of stepped walls may be determined based on requirements about the bonding strength and thickness of the rigid board 130, and so on. The present disclosure does not limit the number of stepped walls.

Further, as shown in FIG. 2, a height of the stepped wall adjacent to the flexible board 110 in a lamination direction of the composite circuit board 100 may be in a range of 0.05 mm-0.5 mm.

In detail, in the present embodiment, the stepped wall adjacent to the flexible board 110 is formed from the adhesive layer 150. A height of the adhesive layer 150 in the lamination direction of the composite circuit board 100, i.e., a thickness H1 of the adhesive layer 150 in a direction D shown in FIG. 2, may be in a range of 0.05 mm-0.5 mm. For example, the thickness of the adhesive layer 150 may be 0.05 mm, 0.1 mm, 0.15 mm, 0.2 mm, 0.25 mm, 0.3 mm, 0.4 mm, 0.45 mm or 0.5 mm. 0.25 mm, 0.3 mm, 0.35 mm, 0.4 mm, 0.45 mm, 0.5 mm, and so on. The present disclosure does not limit a specific thickness of the adhesive layer 150.

Further, a width of an orthographic projection of each stepped wall onto the flexible board 110 in a direction perpendicular to the lamination direction of the composite circuit board 100 may be in a range of 0.5 mm-2.5 mm.

In detail, as shown in FIG. 2, the width S1 of a part of the adhesive layer 150 exposed from the rigid board 130 in the direction perpendicular to the D direction shown in FIG. 2 may be in a range of 0.5 mm-2.5 mm. For example, the width S1 of a part of the adhesive layer 150 exposed from the rigid board 130 in the direction perpendicular to the D direction shown in FIG. 2 may be 0.5 mm, 1 mm, 1.5 mm, 2 mm, 2.5 mm, and so on. The present disclosure does not limit a specific width.

A width S2 of the stepped wall of the rigid board 130 in the direction perpendicular to the direction D shown in FIG. 2 may be in a range of 0.5 mm-2.5 mm. For example, the width S2 of the stepped wall of the rigid board 130 in the direction perpendicular to the direction D shown in FIG. 2 may be 0.5 mm, 1 mm, 1.5 mm, 2 mm, 2.5 mm, and so on. The present disclosure does not limit a specific width.

Further, a width of an orthographic projection of the protective adhesive 170 onto the flexible board 110 in the direction perpendicular to the lamination direction of the composite circuit board 100 may be in a range of 0.5 mm-2.5 mm. In detail, as shown in FIG. 2, the width of the orthographic projection of the protective adhesive 170 onto the flexible board 110 in the direction perpendicular to the direction D shown in FIG. 2 may be in a range of 0.5 mm-2.5 mm. For example, the width of the orthographic projection of the protective adhesive 170 onto the flexible board 110 in the direction perpendicular to the direction D shown in FIG. 2 may be 0.5 mm, 1 mm, 1.5 mm, 2 mm, 2.5 mm, and so on. The present disclosure does not limit a specific width.

Figure 3:
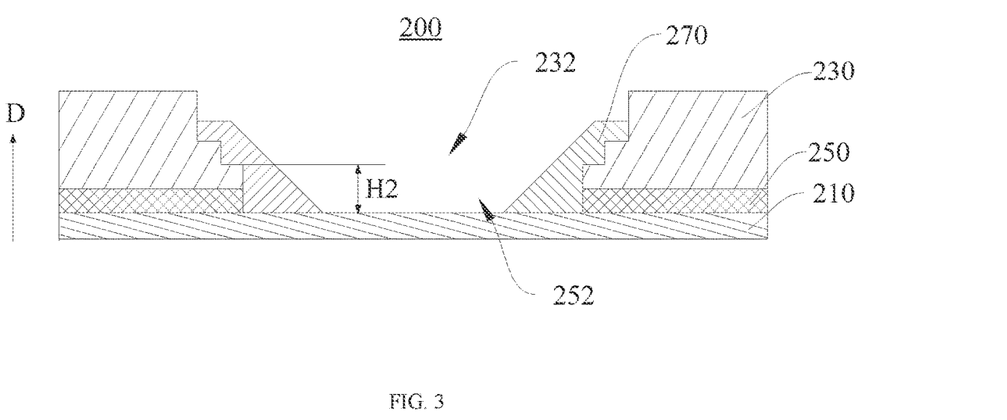
FIG. 3 is a cross-sectional view of a composite circuit board according to another embodiment of the present disclosure.

Further, as shown in FIG. 3, FIG. 3 is a cross-sectional view of a composite circuit board according to another embodiment of the present disclosure. A structure of the composite circuit board 200 in the present embodiment is substantially the same as the structure of the composite circuit board 100 shown in FIG. 2. Specifically, in the present embodiment, the stepped groove 232 has at least two stepped walls. A cross-sectional area of the stepped groove 232 gradually decreases in a direction approaching the flexible board 210. Further, a portion of the side wall of the stepped groove 232 at a position having a smallest cross-sectional area may overlap with the side wall of the through slot 252.

In detail, in the present embodiment, the stepped groove 232 has two stepped surfaces. In the direction approaching the flexible board 210, i.e., in the direction D shown in the FIG. 3, the cross-sectional area of the stepped groove 232 gradually decreases, such that processing the stepped groove 232 may be performed easily on the rigid board 230, and processing the through slot 252 may be easily performed on the adhesive layer 250. The side wall of the through slot 252 may be overlapped with the side wall of the stepped groove 232 near the adhesive layer 250. The protective adhesive 270 covers two stepped walls in the stepped groove 232, the side of the adhesive layer 250 adjacent to the flexible board 210 and a part of the surface of the flexible board 210 adjacent to the adhesive layer 250. By defining the stepped groove 232, which has the at least two stepped walls, in the rigid board 230, a height of each of the at least two stepped walls in the lamination direction of the composite circuit board 200 may be increased, such that the contact area between the protective adhesive 270 and the rigid board 230 and between the protective adhesive 270 and the adhesive layer 250 may be increased, and an adhesive layer 250 having a relatively large thickness may not be arranged. Therefore, the amount of material used for making the adhesive layer 250 may be reduced, and production costs may be reduced.

The number of stepped walls in the stepped groove 232 may be three, four, five, and so on, which may be determined based on requirements of the bonding strength and the thickness of the rigid board 230, and so on. The present disclosure does not limit the number of stepped walls.

In the present embodiment, the stepped wall adjacent to the flexible board 210 is formed from the adhesive layer 250 and a stepped wall of the rigid board 230 near the adhesive layer 250. A height of the stepped wall adjacent to the flexible board 210 in the lamination direction of the composite circuit board 200, i.e., a thickness H2 of the adhesive layer 250 and the stepped wall of the rigid board 230 near the adhesive layer 250 in the direction D shown in FIG. 3, may be in a range of 0.05 mm-0.5. For example, the thickness H2 of the adhesive layer 250 and the stepped wall of the rigid board 230 near the adhesive layer 250 may be 0.05 mm, 0.1 mm, 0.15 mm, 0.2 mm, 0.25 mm, 0.3 mm, 0.35 mm, 0.4 mm, 0.45 mm, 0.5 mm, and so on. The present disclosure does not limit a specific thickness.

Figure 4:
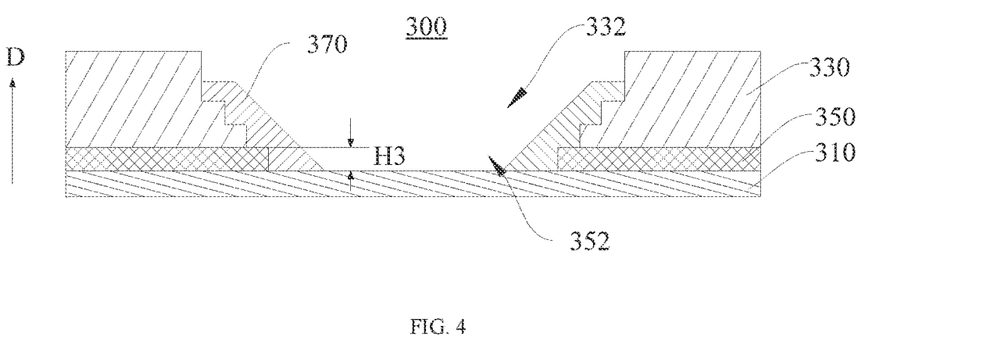
FIG. 4 is a cross-sectional view of a composite circuit board according to still another embodiment of the present disclosure.

In another embodiment, as shown in FIG. 4, FIG. 4 is a cross-sectional view of a composite circuit board according to still another embodiment of the present disclosure. A structure of the composite circuit board 300 in the present embodiment is substantially the same as the structure of the composite circuit board 200 shown in FIG. 3. Specifically, in the present embodiment, a side wall of the stepped groove 332 at a position having a smallest cross-sectional area is disposed at a periphery of the through slot 352.

In detail, an orthographic projection of a side wall of the stepped groove 332 near the adhesive layer 350 onto the adhesive layer 350 is located at a periphery of the side wall of the through slot 352, such that at least a part of a circumference of the adhesive layer 350 is exposed from the rigid board 330 to serve as a stepped wall. The protective adhesive 370 covers the two stepped walls of the stepped groove 332, the surface of the adhesive layer 350 exposed from the rigid board 330, a side of the adhesive layer 350 adjacent to the flexible board 310, and a part of the surface of the flexible board 310 adjacent to the adhesive layer 350. In this way, the contact area between the protective adhesive 370 and the rigid board 330 and between the protective adhesive 370 and the adhesive layer 350 may be further increased, such that the connection between the protective adhesive 370 and the composite circuit board 300 may be improved.

In the present embodiment, the stepped wall adjacent to the flexible board 310 is formed by the adhesive layer 350. The height of the adhesive layer 350 in the lamination direction of the composite circuit board 300, i.e., the thickness H3 of the adhesive layer 350 in the direction D shown in FIG. 4, may be in a range of 0.05 mm-0.5 mm. For example, the thickness of the adhesive layer 350 may be 0.05 mm, 0.1 mm, 0.15 mm, 0.2 mm, 0.25 mm, 0.3 mm, 0.35 mm, 0.4 mm, 0.45 mm, 0.5 mm, and so on. The present disclosure does not limit a specific thickness.

Figure 5:
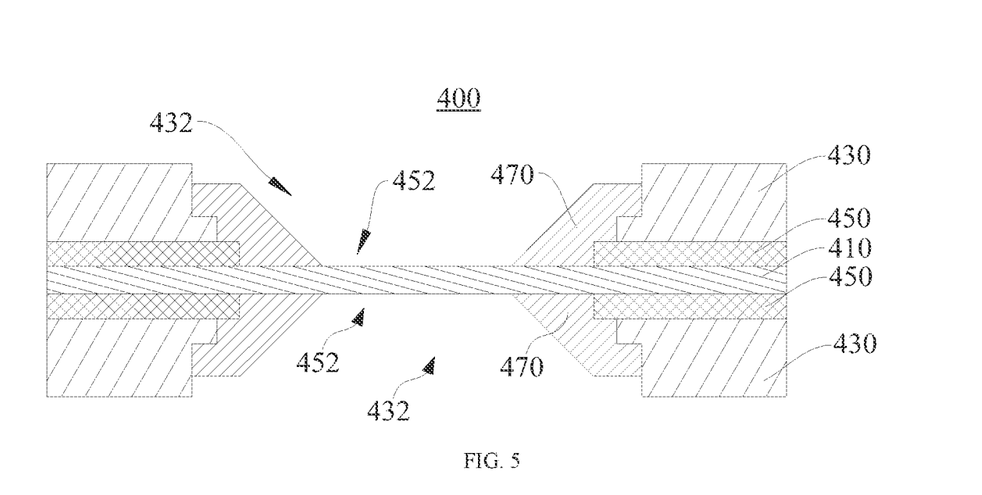
FIG. 5 is a cross-sectional view of a composite circuit board according to still another embodiment of the present disclosure.

In another embodiment, as shown in FIG. 5, FIG. 5 is a cross-sectional view of a composite circuit board according to still another embodiment of the present disclosure. The number of rigid boards 430 is two, and the number of adhesive layers 450 is two. The two rigid boards 430 are arranged on opposite sides of the flexible board 410, along the lamination direction of the composite circuit board 100. The adhesive layer 450 is disposed between the flexible board 410 and a corresponding rigid board 430 to bond the corresponding rigid board 430 with the flexible board 410. For example, a first rigid board 430 and a second rigid board 430 are arranged, and a first adhesive layer 450 and a second adhesive layer 450 are arranged. The first adhesive layer 450 is disposed between the flexible board 410 and the first rigid board 430 to bond the first rigid board 430 with the flexible board 410; and the second adhesive layer 450 is disposed between the flexible board 410 and the second rigid board 430 to bond the second rigid board with the flexible board 410. The first rigid board 430 defines a first stepped groove that extends through the first rigid board 430, and the second rigid board 430 defines a second stepped groove that extends through the second rigid board 430. The first adhesive layer 450 defines a first through slot 452 that extends through the first adhesive layer 450, and the second adhesive layer 450 defines a second through slot 452 that extends through the second adhesive layer 450. The first stepped groove 432 and the first through slot 452 are communicated with each other to form a first thinning groove. The second stepped groove 432 and the second through slot 452 are communicated with each other to form a second thinning groove. The opposite sides of the flexible board 410 is exposed from the first thinning groove and the second thinning groove respectively. The protective adhesive 470 is arranged on each of the opposite sides of the flexible board 410 along the lamination direction of the composite circuit board 100. The protective adhesive 470 covers the corresponding stepped walls and at least a part of the exposed region of the flexible board 410.

In the present embodiment, the rigid boards 430, the adhesive layers 450 and the protective adhesive 470, which are disposed on opposite sides of the flexible board 410, may be arranged in a same manner as those described in the above embodiments. The arrangement of the rigid boards 430, the adhesive layers 450 and the protective adhesive 470 may be referred to the description in the above embodiment and will not be repeated here. By arranging the rigid boards 430 on the opposite sides of the flexible board 410, the number of lines on the composite circuit board 400 may be increased, such that more electronic elements may be connected, and the opposite sides of the flexible board 410 may be subjected to equal forces.

Figure 6:
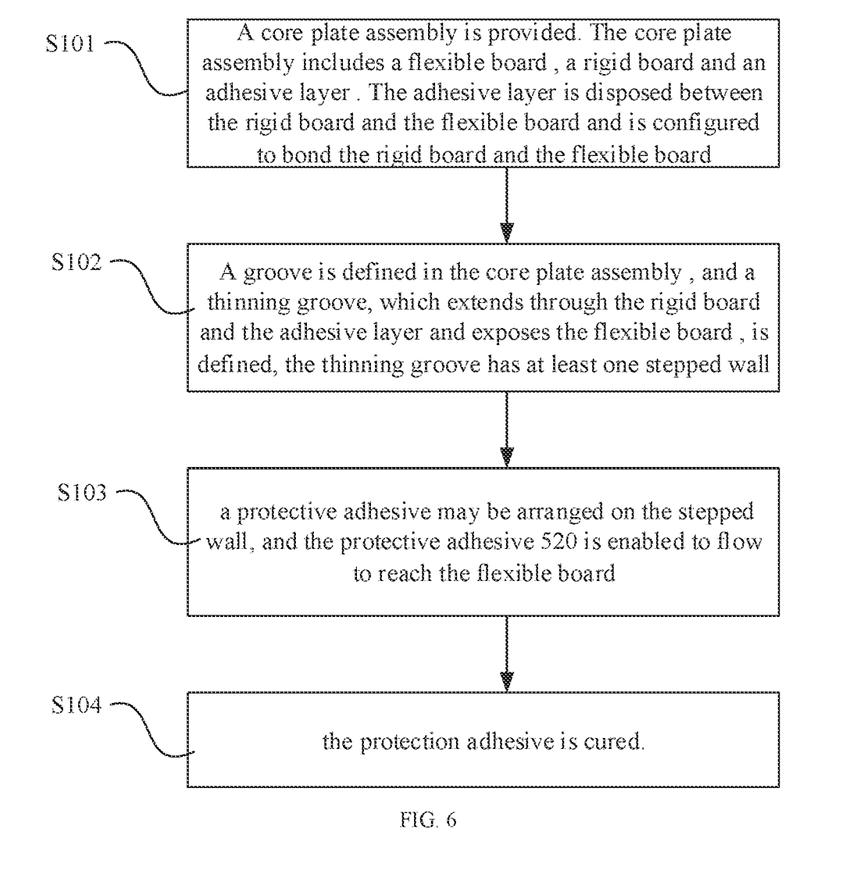
FIG. 6 is a flow chart of a method of manufacturing a composite circuit board according to an embodiment of the present disclosure.

According to another aspect, the present disclosure provides a method of manufacturing the composite circuit board 500. As shown in FIG. 6, FIG. 6 is a flow chart of a method of manufacturing a composite circuit board according to an embodiment of the present disclosure. In the following, the method of manufacturing the composite circuit board 500 will be described in detail by referring to FIGS. 7 to 9. The method of manufacturing the composite circuit board 500 may include following operations.

Figure 7:
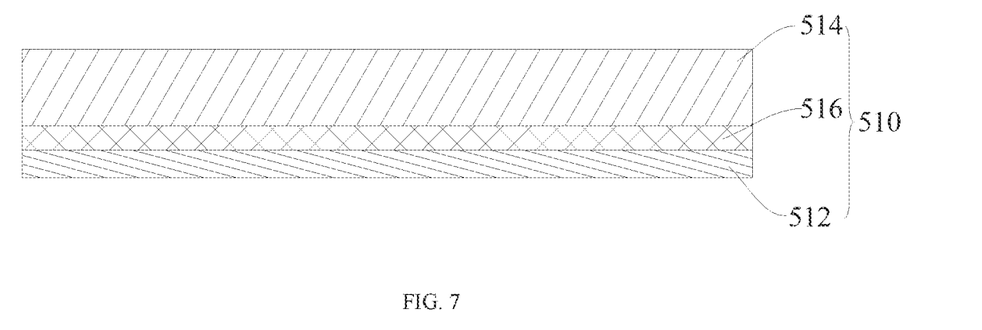
FIG. 7 is a cross-sectional view of a core plate assembly according to an embodiment of the present disclosure.

In an operation S101, a core plate assembly 510 is provided. The core plate assembly 510 includes a flexible board 512, a rigid board 514 and an adhesive layer 516. The adhesive layer 516 is disposed between the rigid board 514 and the flexible board 512 and is configured to bond the rigid board 514 and the flexible board 512.

In detail, materials of the rigid board 514 and the flexible board 512 and methods of manufacturing the rigid board 514 and the flexible board 512 are available in the art and may be referred to. The present disclosure will not describe the materials and the manufacturing method in detail. The adhesive layer 516 may be made of at least one of a pure adhesive or a semi-cured sheet.

In an embodiment, the adhesive layer 516 may be made of the pure adhesive. A layer of pure adhesive may be coated to a surface of the flexible board 512. The rigid board 514 may be bonded to the flexible board 512 to form the core plate assembly 510. Taking the pure adhesive to bond the flexible board 512 with the rigid board 514 may be performed at room temperature. In this way, a process of connecting the rigid board 514 with the flexible board 512 may be simplified.

In another embodiment, the adhesive layer 516 may be made of the semi-cured sheet. In detail, a solid semi-cured sheet may be arranged on the surface of the flexible board 512. The rigid board 514 may be disposed on a side of the semi-cured sheet away from the flexible board 512. A heat-pressing operation may be performed on the flexible board 512, the semi-cured sheet and the rigid board 514, which are laminated on each other, such that the flexible board 512, the semi-cured sheet and the rigid board 514 may form an integral one-piece structure. By taking the semi-cured sheet to bond the flexible board 512 and the rigid board 514, a height of the adhesive layer 516 may be easily controlled.

Figure 8:
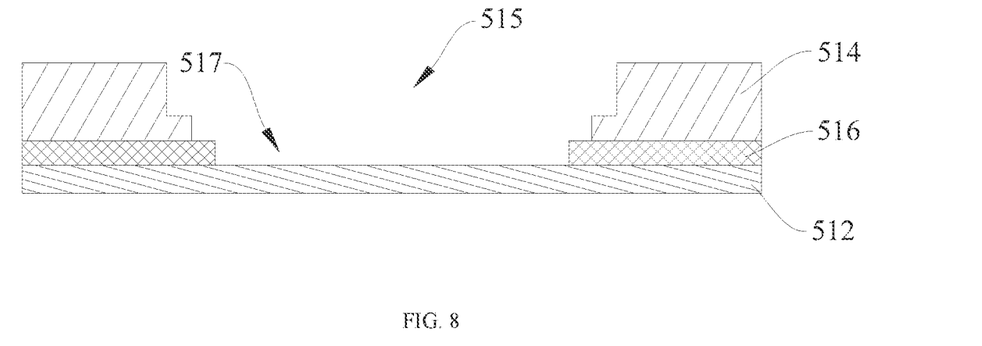
FIG. 8 is a cross-sectional view of the core plate assembly, shown in FIG. 7, defining the thinning groove.

In an operation S102, a groove is defined in the core plate assembly 510, such that a thinning groove, which extends through the rigid board 514 and the adhesive layer 516 and exposes the flexible board 512, is defined, and the thinning groove has at least one stepped wall.

In detail, controlled depth milling may be performed to define the thinning groove in the core plate assembly 510. For example, a cross-sectional area and a height of a stepped wall furthest away from the flexible board 512 may be determined in advance. Further, processing may be firstly performed on a surface of the rigid board 514 away from the flexible board 512 to define a first stepped wall. Further, a width and a height of a second stepped wall adjacent to the first stepped wall may be predetermined. A drill bit may be controlled to move to an inside of a region enclosed by the stepped wall, and a distance that the drill bit is moved may be equal to the width of the second stepped wall. Further, a depth of a drilled hole may be controlled to be equal to the height of the second stepped wall. In this way, the second stepped wall may be defined. Similarly, a stepped groove 515 in the rigid board 514 and a through slot 517 in the adhesive layer 516 may be successively defined. The through slot 517 and the stepped groove 515 are communicated with each other to form the thinning groove.

While the drill bit is being controlled to move to the inside of the region enclosed by the stepped wall, the distance that the drill bit is moved may be controlled in a range of 0.5 mm to 2.5 mm, such that the drill bit may perform the processing easily, and strength of each stepped wall may be ensured.

Figure 9:
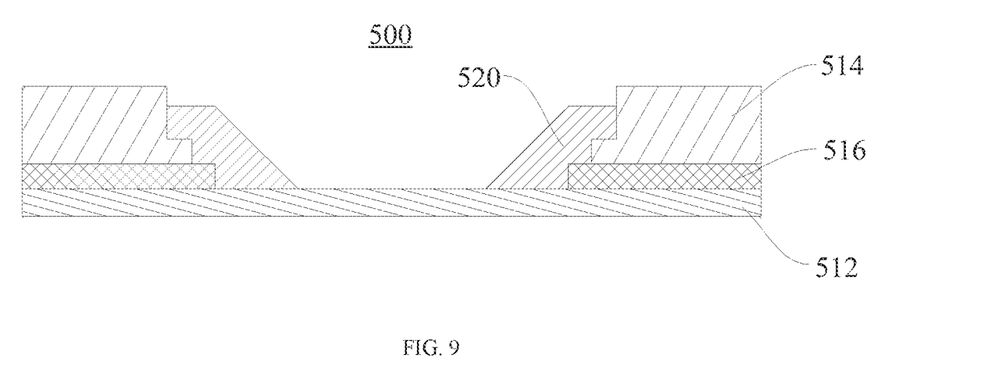
FIG. 9 is a cross-sectional view of the core plate assembly, shown in FIG. 8, having dispensed adhesive.

In an operation S103, a protective adhesive 520 may be arranged on the stepped wall, and the protective adhesive 520 is enabled to flow to reach the flexible board 512.

In detail, the protective adhesive 520 is pre-loaded in a dispensing machine. The dispensing machine is controlled to apply the protective adhesive 520 on the stepped wall. The protective adhesive 520 in a liquid phase may flow under the gravitational force along the stepped wall in a direction approaching the flexible board 512, reaching a part of a surface of the flexible board 512 adjacent to the adhesive layer 516.

The protective adhesive 520 may be at least one of an epoxy adhesive or an acrylic adhesive. For example, the protective adhesive 520 may be the epoxy adhesive. In some embodiments, the protective adhesive 520 may be the acrylic adhesive. In some embodiments, the protective adhesive 520 may be a mixture of the epoxy adhesive and the acrylic adhesive. The present disclosure does not limit composition of the protective adhesive 520.

Figure 10:
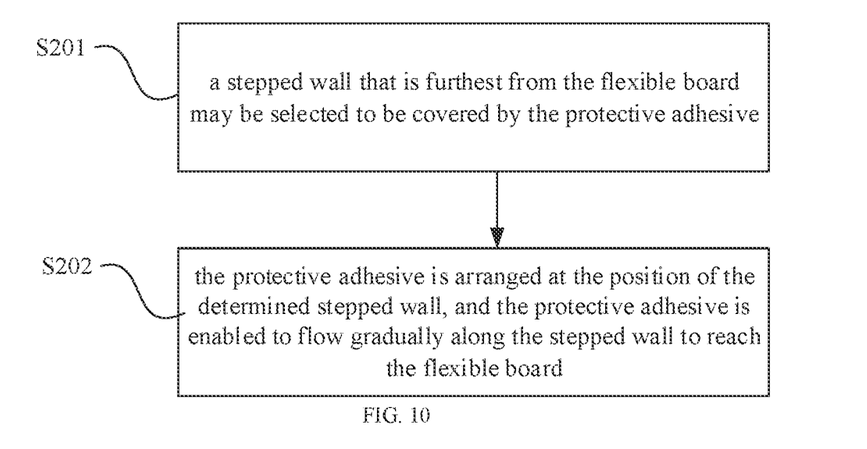
FIG. 10 is a flow chart of the operation S103 shown in FIG. 6.

Further, as shown in FIG. 9 and FIG. 10, FIG. 10 is a flow chart of the operation S103 shown in FIG. 6. The operation of applying the protective adhesive 520 on the stepped wall may include following operations.

In an operation S201, a stepped wall that is furthest from the flexible board 512 may be selected to be covered by the protective adhesive 520.

In detail, the stepped wall, which is furthest from the flexible board 512 and will be covered by the protective adhesive 520, may be determined based on parameters, such as requirements of bonding strength and the thickness of the rigid board 514. For example, in an embodiment, the protective adhesive 520 needs to cover two stepped walls, and therefore, a stepped, which is two stepped-wall away from the flexible board 512, may be determined a position for dispensing adhesive.

In an operation S202, the protective adhesive 520 is arranged at the position of the determined stepped wall, and the protective adhesive 520 is enabled to flow gradually along the stepped wall to reach the flexible board 512.

The dispensing machine starts dispensing the adhesive at the selected position. The adhesive in the liquid phase, under the gravitational force, flows from the dispensing position in the direction approaching the flexible board 512, reaching the surface of the part of the flexible board 512 adjacent to the adhesive layer 516.

An extension length of the adhesive on the surface of the flexible board 512 may be controlled by controlling the amount of the adhesive and a time length of dispensing the adhesive, such that a sum of the width of the adhesive on the stepped wall and the extension length of the adhesive on the flexible board 512 may be in a range of 0.5 mm-2.5 mm. In this way, while strength of the connection between the protective adhesive 520 and the rigid board 514 and the flexible board 512 may be improved, the extension length of the protective adhesive 520 on the flexible board 512 may be reduced, such that the amount of the applied adhesive may be reduced, and manufacturing costs may be reduced.

In an operation S104, the protection adhesive 520 is cured.

The composite circuit board 500, which has the dispensed adhesive, is left stationary for a period of time, allowing the protective adhesive 520 to be solidified naturally. In some embodiments, the dispensing position may be cooled to accelerate solidification of the protective adhesive 520. Curing time may be shortened, and a production efficiency may be improved.

The above shows only examples of the present disclosure, and is not intended to limit the scope of the present disclosure. Any equivalent structure or equivalent process transformation performed based on the specification and the accompanying drawings of the present disclosure, applied directly or indirectly in other fields, shall be equally covered by the present disclosure.

What is claimed is:

1. A composite circuit board, comprising: a flexible board, a rigid board, an adhesive layer and a protective adhesive,
    wherein the adhesive layer is disposed between the rigid board and the flexible board and configured to bond the rigid board with the flexible board;
    the rigid board defines a stepped groove that extends through the rigid board, the adhesive layer defines a through slot that extends through the adhesive layer, the stepped groove and the through slot are communicated with each other to form a thinning groove;

the flexible board is exposed from the thinning groove;

the protective adhesive covers at least one stepped wall of the thinning groove and at least a part of an exposed region of the flexible board;

a height of one of the at least one stepped wall adjacent to the flexible board is in a range of 0.05 mm to 0.5 mm in a lamination direction of the composite circuit board; and a width of an orthographic projection of each of the at least one stepped wall onto the flexible board in a direction perpendicular to the lamination direction is in a range of 0.5 mm to 2.5 mm.

2. The composite circuit board according to claim 1, wherein a side wall of the stepped groove has a side facing towards an inside of the thinning groove; and a side wall of the through slot is disposed on the side and is served as another stepped wall.

3. The composite circuit board according to claim 1, wherein the stepped groove has at least two stepped walls;
a cross-sectional area of the stepped groove decreases in a direction approaching the flexible board;
a side wall of the stepped groove at a position having a smallest cross-sectional area is overlapped with the side wall of the through slot or is disposed at a periphery of the through slot.

4. The composite circuit board according to claim 1, wherein the rigid board comprises a first rigid board and a second rigid board, and the adhesive layer comprises a first adhesive layer and a second adhesive layer, the stepped groove comprises a first stepped groove and a second stepped groove, the through slot comprises a first through slot and a second through slot, the thinning groove comprises a first thinning groove and a second thinning groove;
the first rigid board and the second rigid board are arranged on opposite sides of the flexible board, along the lamination direction of the composite circuit board;
the first adhesive layer is disposed between the flexible board and the first rigid board to bond the first rigid board with the flexible board, and the second adhesive layer is disposed between the flexible board and the second rigid board to bond the second rigid board with the flexible board;
the first rigid board defines the first stepped groove that extends through the first rigid board, and the second rigid board defines the second stepped groove that extends through the second rigid board; the first adhesive layer defines the first through slot that extends through the first adhesive layer, and the second adhesive layer defines the second through slot that extends through the second adhesive layer;
the first stepped groove and the first through slot are communicated with each other to form the first thinning groove, the second stepped groove and the second through slot are communicated with each other to form the second thinning groove, the opposite sides of the flexible board are exposed from the first thinning groove and the second thinning groove respectively;
the protective adhesive is arranged on each of the opposite sides of the flexible board along the lamination direction of the composite circuit board, and the protective adhesive covers the at least one stepped wall and at least a part of the exposed side of the flexible board.

5. The composite circuit board according to claim 1, wherein a width of an orthographic projection of the protective adhesive on the flexible board, in a direction perpendicular to the lamination direction of the composite circuit board, is in a range of 0.5 mm to 2.5 mm.

6. The composite circuit board according to claim 1, wherein the protective adhesive is made of at least one of an epoxy adhesive and an acrylic adhesive.

7. The composite circuit board according to claim 1, wherein the adhesive layer is at least one of a pure adhesive and a semi-cured sheet.

8. The composite circuit board according to claim 1, wherein the adhesive layer is a high speed pure adhesive, and the high speed pure adhesive has a dielectric loss of less than or equal to 3.0.

9. A composite circuit board, comprising: a flexible board, a rigid board, an adhesive layer and a protective adhesive,
wherein the adhesive layer is disposed between the rigid board and the flexible board and configured to bond the rigid board with the flexible board;
the rigid board defines a stepped groove that extends through the rigid board, the adhesive layer defines a through slot that extends through the adhesive layer, the stepped groove and the through slot are communicated with each other to form a thinning groove;
the flexible board is exposed from the thinning groove;
the protective adhesive covers at least one stepped wall of the thinning groove and at least a part of an exposed region of the flexible board.

10. The composite circuit board according to claim 9, wherein a side wall of the stepped groove has a side facing towards an inside of the thinning groove; and a side wall of the through slot is disposed on the side and is served as another stepped wall.

11. The composite circuit board according to claim 9, wherein the stepped groove has at least two stepped walls;
a cross-sectional area of the stepped groove decreases in a direction approaching the flexible board;
a side wall of the stepped groove at a position having a smallest cross-sectional area is overlapped with the side wall of the through slot or is disposed at a periphery of the through slot.

12. The composite circuit board according to claim 9, wherein the rigid board comprises a first rigid board and a second rigid board, and the adhesive layer comprises a first adhesive layer and a second adhesive layer, the stepped groove comprises a first stepped groove and a second stepped groove, the through slot comprises a first through slot and a second through slot, the thinning groove comprises a first thinning groove and a second thinning groove;
the first rigid board and the second rigid board are arranged on opposite sides of the flexible board, along the lamination direction of the composite circuit board;
the first adhesive layer is disposed between the flexible board and the first rigid board to bond the first rigid board with the flexible board, and the second adhesive layer is disposed between the flexible board and the second rigid board to bond the second rigid board with the flexible board;
the first rigid board defines the first stepped groove that extends through the first rigid board, and the second rigid board defines the second stepped groove that extends through the second rigid board; the first adhesive layer defines the first through slot that extends through the first adhesive layer, and the second adhesive layer defines the second through slot that extends through the second adhesive layer;
the first stepped groove and the first through slot are communicated with each other to form the first thinning groove, the second stepped groove and the second through slot are communicated with each other to form the second thinning groove, the opposite sides of the flexible board are exposed from the first thinning groove and the second thinning groove respectively;

the protective adhesive is arranged on each of the opposite sides of the flexible board along the lamination direction of the composite circuit board, and the protective adhesive covers the at least one stepped wall and at least a part of the exposed side of the flexible board.

13. The composite circuit board according to claim 9, wherein a height of one of the at least one stepped wall adjacent to the flexible board is in a range of 0.05 mm to 0.5 mm in a lamination direction of the composite circuit board.

14. The composite circuit board according to claim 9, wherein a width of an orthographic projection of each of the at least one stepped wall onto the flexible board in a direction perpendicular to the lamination direction is in a range of 0.5 mm to 2.5 mm.

15. The composite circuit board according to claim 9, wherein a width of an orthographic projection of the protective adhesive on the flexible board, in a direction perpendicular to the lamination direction of the composite circuit board, is in a range of 0.5 mm to 2.5 mm.

16. The composite circuit board according to claim 9, wherein the protective adhesive is made of at least one of an epoxy adhesive and an acrylic adhesive.

17. The composite circuit board according to claim 9, wherein the adhesive layer is at least one of a pure adhesive and a semi-cured sheet.

18. The composite circuit board according to claim 9, wherein the adhesive layer is a high speed pure adhesive, and the high speed pure adhesive has a dielectric loss of less than or equal to 3.0.

19. A method of manufacturing a composite circuit board, comprising:

providing a core plate assembly, wherein the core plate assembly comprises a flexible board, a rigid board and an adhesive layer, the adhesive layer is disposed between the rigid board and the flexible board and is configured to bond the rigid board and the flexible board;

defining a groove in the core plate assembly to define a thinning groove, which extends through the rigid board and the adhesive layer and exposes the flexible board, wherein the thinning groove has at least one stepped wall;

applying a protective adhesive on the at least one stepped wall, and enabling the protective adhesive to flow to reach the flexible board; and curing the protection adhesive.

20. The method according to claim 19, wherein the applying a protective adhesive on the at least one stepped wall, comprises:

selecting a stepped wall, which is furthest from the flexible board and is to be covered by the protective adhesive, from the at least one stepped wall; and applying the protective adhesive at selected a position wherein the stepped wall is arranged, enabling the protective adhesive to flow along the at least one stepped wall to reach the flexible board.

* * * * *